(12) United States Patent
Yamashita

(10) Patent No.: US 8,831,903 B2
(45) Date of Patent: Sep. 9, 2014

(54) TEST APPARATUS, TEST METHOD AND SYSTEM

(75) Inventor: Hironaga Yamashita, Saitama (JP)

(73) Assignee: Advantest Corporation, Tokyo (JP)

( * ) Notice: Subject to any disclaimer, the term of this patent is extended or adjusted under 35 U.S.C. 154(b) by 973 days.

(21) Appl. No.: 12/943,815

(22) Filed: Nov. 10, 2010

(65) Prior Publication Data

US 2011/0282617 A1   Nov. 17, 2011

Related U.S. Application Data

(63) Continuation of application No. PCT/JP2008/065456, filed on Aug. 28, 2008.

(60) Provisional application No. 61/057,205, filed on May 30, 2008.

(51) Int. Cl.
*G01R 31/319* (2006.01)
*G01R 31/28* (2006.01)
*G06F 11/30* (2006.01)
*G06F 17/40* (2006.01)
*G06F 19/00* (2011.01)

(52) U.S. Cl.
CPC ...... *G01R 31/31907* (2013.01); *G01R 31/2806* (2013.01); *G01R 31/31903* (2013.01); *G06F 11/3051* (2013.01); *G06F 17/40* (2013.01); *G06F 19/00* (2013.01)
USPC .......... 702/122; 324/750.01; 370/255; 702/1; 702/127; 702/187; 709/242

(58) Field of Classification Search
CPC ........... G01D 7/00; G01D 9/00; G01D 21/00; G01R 31/00; G01R 31/28; G01R 31/2801; G01R 31/2803; G01R 31/2806; G01R 31/317; G01R 31/31722; G01R 31/3181; G01R 31/319; G01R 31/31903; G01R 31/31907; G01R 31/3193; G06F 11/00; G06F 11/30; G06F 11/3003; G06F 11/3306; G06F 11/3048; G06F 11/3051; G06F 11/32; G06F 11/34; G06F 17/00; G06F 17/40; G06F 19/00; H04L 12/00; H04L 12/28; H04L 12/44; H04L 2012/00; H04L 2012/28; H04L 2012/44

USPC ............ 73/1.01, 432.1, 865.8; 324/500, 537, 324/763.01; 340/425.1, 500, 540, 635, 653; 370/254, 255, 256, 351, 389, 392, 393; 375/224; 702/1, 85, 108, 117, 120, 702/122, 182, 187, 189; 706/14; 709/220, 709/223, 238, 242, 245; 710/100, 104
See application file for complete search history.

(56) References Cited

U.S. PATENT DOCUMENTS 3,082,374 A * 3/1963 Buuck ........................ 324/73.1
(Continued)

FOREIGN PATENT DOCUMENTS

JP    3-136537 A    6/1991
JP    4-98443 A     3/1992
(Continued)

OTHER PUBLICATIONS

Korean Office Action dated Sep. 30, 2011, in a counterpart Korean Patent application No. 10-2010-7025904.

(Continued)

*Primary Examiner* — Edward Cosimano

(57) ABSTRACT

A test apparatus for testing a device under test includes a control apparatus, a plurality of test modules, and a plurality of relay apparatuses that connect the control apparatus and the plurality of test modules, each relay apparatus including (1) an upper port section connected either to the control apparatus or to a relay apparatus nearer the control apparatus; and (2) at least one lower port section connected either to a relay apparatus nearer the plurality of test modules or to a corresponding test module, where each relay apparatus receives, at one of the at least one lower port section, a packet transmitted from the corresponding test module to the control apparatus, and transmits, from the upper port section, the received packet after adding thereto port identification information of the one of the at least one lower port section.

10 Claims, 11 Drawing Sheets

(56) References Cited

U.S. PATENT DOCUMENTS

| | | | | |
|---|---|---|---|---|
| 3,764,995 | A | * | 10/1973 | Helf et al. .................. 714/32 |
| 4,807,161 | A | * | 2/1989 | Comfort et al. .............. 702/121 |
| 7,290,192 | B2 | * | 10/2007 | Ichiyoshi .................... 714/742 |
| 7,340,364 | B1 | | 3/2008 | Kumaki |
| 2004/0193990 | A1 | * | 9/2004 | Ichiyoshi .................... 714/742 |
| 2004/0267999 | A1 | | 12/2004 | Larson et al. |
| 2006/0224926 | A1 | | 10/2006 | Iwamoto |
| 2008/0091377 | A1 | | 4/2008 | Kumaki |

FOREIGN PATENT DOCUMENTS

| | | |
|---|---|---|
| JP | H05-081165 A | 4/1993 |
| JP | 2005-4746 A | 1/2005 |
| KR | 10-2007-0121020 A | 12/2007 |
| WO | 2008/044421 A1 | 4/2008 |

OTHER PUBLICATIONS

International Search Report (ISR) issued in PCT/JP2008/065456 (parent application) mailed in Nov. 2008 for Examiner consideration.

Written Opinion (PCT/ISA/237) issued in PCT/JP2008/065456 (parent application) mailed in Nov. 2008.

Applicants bring the attention of the Examiner to the following pending U.S. Appl. Nos. 12/942,912, filed Nov. 9, 2010 and U.S. Appl. No. 12/942,917, filed Nov. 9, 2010.

International Search Report (ISR) issued in PCT/JP2008/062864 (related application) mailed in Oct. 2008 for Examiner consideration.

Written Opinion (PCT/ISA/237) issued in PCT/JP2008/062864 (related application) mailed in Oct. 2008.

International Search Report (ISR) issued in PCT/JP2008/065458 (related application) mailed in Nov. 2008 for Examiner consideration.

Written Opinion (PCT/ISA/237) issued in PCT/JP2008/065458 (related application) mailed in Nov. 2008.

* cited by examiner

```
0x1000.0001

0x0300.0102
0x0200.0202
0x0100.0302

0x0000.0000

0x0901.0104
0x0802.0104
0x0703.0104
0x0601.0204
0x0502.0204
0x0403.0204
```

| | RESET VALUE | PATH INFORMATION | LOGIC NUMBER |
|---|---|---|---|
| 1 | 0 × 007f. 7f01 | 0 × 0000. 0302 | 1 |
| 2 | 0 × 007f. 7f02 | 0 × 0000. 0202 | 2 |
| 3 | 0 × 007f. 7f03 | 0 × 0000. 0102 | 3 |
| 4 | 0 × 007f. 7f04 | 0 × 0003. 0204 | 4 |
| 5 | 0 × 0000. 0000 | 0 × 0002. 0204 | 5 |
| 6 | 0 × 0000. 0000 | 0 × 0001. 0204 | 6 |
| 7 | 0 × 0000. 0000 | 0 × 0003. 0104 | 7 |
| 8 | 0 × 0000. 0000 | 0 × 0002. 0104 | 8 |
| 9 | 0 × 0000. 0000 | 0 × 0001. 0104 | 9 |
| 10 | 0 × 0000. 0000 | 0 × 0000. 0001 | 10 |
| 11 | 0 × 0000. 0000 | 0 × 0000. 0000 | |
| ⋮ | ⋮ | ⋮ | |
| 62 | 0 × 0000. 0000 | 0 × 0000. 0000 | |
| 63 | 0 × 0000. 0000 | 0 × 0000. 0000 | |
| 64 | 0 × 0000. 0000 | 0 × 0000. 0000 | |

*FIG. 8*

| Command | A0-A2 |
|---|---|
| 3byte | 3byte |

Command
Code0                             0×24     Normal Single Read24
Primarry Switch field     0×02     Port=2
Secondary Switch field    0×01     Port=1
A0-A2                          0×120    OFFSET FROM ENTRY

*FIG. 10*

| Command | A0-A2 | D0-D3 |
|---|---|---|
| 3byte | 3byte | 4byte |

Command
Code0                             0×25     Normal Single Read Data24
Primarry Switch field     0
Secondary Switch field    0
A0-A2                          0×120
D0-D3                        0×12345678

*FIG. 11*

| Command | A0-A2 | D0-D3 |
|---|---|---|
| 3byte | 3byte | 4byte |

Command
Code0                         0×42     Normal Single Read Data24
Primarry Switch field         0
Secondary Switch field        0×01     Port=1
A0-A2                         0×120
D0-D3                         0×12345678

*FIG. 12*

| Command | A0-A2 | D0-D3 |
|---|---|---|
| 3byte | 3byte | 4byte |

Command
Code0                         0×42     Normal Single Read Data24
Primarry Switch field         0×02     Port=1
Secondary Switch field        0×01     Port=2
A0-A2                         0×120
D0-D3                         0×12345678

*FIG. 13*

TEST APPARATUS, TEST METHOD AND SYSTEM

BACKGROUND

1. Technical Field

The present invention relates to a test apparatus, a test method, and a system for testing a device under test.

2. Related Art

A test apparatus for testing a semiconductor apparatus or the like includes a plurality of test modules and a control apparatus. Each test module exchanges a signal with a device under test. The test apparatus is connected to each test module via a bus such as a PCI. Such a test apparatus can change the connection state between the control apparatus and the plurality of test modules.

In the test apparatus, when the connection state between the control apparatus and the plurality of test modules has been changed, the control apparatus performs initialization so as to access each test module. More specifically, the control apparatus reads information from the configuration register of each test module, to assign, in order, the storage regions of the test modules to addresses on an address space of the bus. The control apparatus then writes entry values of the addresses to which the test modules are assigned, to the configuration registers of the test modules respectively. The initialization of the control apparatus can complete in this way.

Such test apparatuses have to perform read and write operations to the respective configuration registers of the plurality of test modules in the initialization. This makes the initialization of such test apparatuses cumbersome.

Moreover in a case where a broadcast command attempting to access all of the plurality of test modules is provided, the control apparatus has to determine the test module that is assigned the address range corresponding to the address designated by the command. However, the control apparatus of such a test apparatus conventionally does not manage the address range assigned to each test module, which makes it difficult to deal with a broadcast command.

SUMMARY

Therefore, it is an object of an aspect of the innovations herein to provide a test apparatus, a test method, and a system, which are capable of overcoming the above drawbacks accompanying the related art. The above and other objects can be achieved by combinations described in the claims.

A first aspect of the innovations may include a test apparatus for testing a device under test, including: a control apparatus that controls a test of the device under test; a plurality of test modules that exchange signals with the device under test; and a plurality of relay apparatuses that connect the control apparatus and the plurality of test modules, each relay apparatus including (1) an upper port section connected either to the control apparatus or to a relay apparatus nearer the control apparatus; and (2) at least one lower port section connected either to a relay apparatus nearer the plurality of test modules or to a corresponding test module, where each relay apparatus receives, at one of the at least one lower port section, a packet transmitted from the corresponding test module to the control apparatus, and transmits, from the upper port section, the received packet after adding thereto port identification information of the one of the at least one lower port section, and the control apparatus identifies, based on port identification information of each of lower port sections positioned on a path from the corresponding test module to the control apparatus, path information to the test module having transmitted the packet.

A second aspect of the innovations may include a test method performed by a test apparatus that tests a device under test, where the test apparatus includes: a control apparatus that controls a test of the device under test; a plurality of test modules that exchange signals with the device under test; and a plurality of relay apparatuses that connect the control apparatus and the plurality of test modules, each relay apparatus including (1) an upper port section connected either to the control apparatus or to a relay apparatus nearer the control apparatus; and (2) at least one lower port section connected either to a relay apparatus nearer the plurality of test modules or to a corresponding test module, the method including: receiving, by each relay apparatus, at one of the at least one lower port section, a packet transmitted from the corresponding test module to the control apparatus, and transmitting, from the upper port section, the received packet after adding thereto port identification information of the one of the at least one lower port section, and identifying, by the control apparatus, based on port identification information of each of lower port sections positioned on a path from the corresponding test module to the control apparatus, path information to the test module having transmitted the packet.

A third aspect of the innovations may include a system including: a control apparatus; a plurality of modules; and a plurality of relay apparatuses that connect the control apparatus and the plurality of modules, each relay apparatus including (1) an upper port section connected either to the control apparatus or to a relay apparatus nearer the control apparatus; and (2) at least one lower port section connected either to a relay apparatus nearer the plurality of modules or to a corresponding module, where each relay apparatus receives, at one of the at least one lower port section, a packet transmitted from the corresponding module to the control apparatus, and transmits, from the upper port section, the received packet after adding thereto port identification information of the one of the at least one lower port section, and the control apparatus identifies, based on port identification information of each of the lower port sections positioned on a path from the corresponding module to the control apparatus, path information to the module having transmitted the packet.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

BRIEF DESCRIPTION OF THE DRAWINGS

FIG. 8 shows an example of path information and logic numbers stored in a storage section 32.

FIG. 10 shows an exemplary packet transmitted from the control apparatus 12 to a test module 14.

FIG. 11 shows an exemplary return packet that a test module 14 returns to a relay apparatus 16.

FIG. 12 shows an exemplary return packet transmitted from a secondary relay apparatus 16.

FIG. 13 shows an exemplary return packet transmitted from a primary relay apparatus 16.

DESCRIPTION OF EXEMPLARY EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention.

Figure 1:
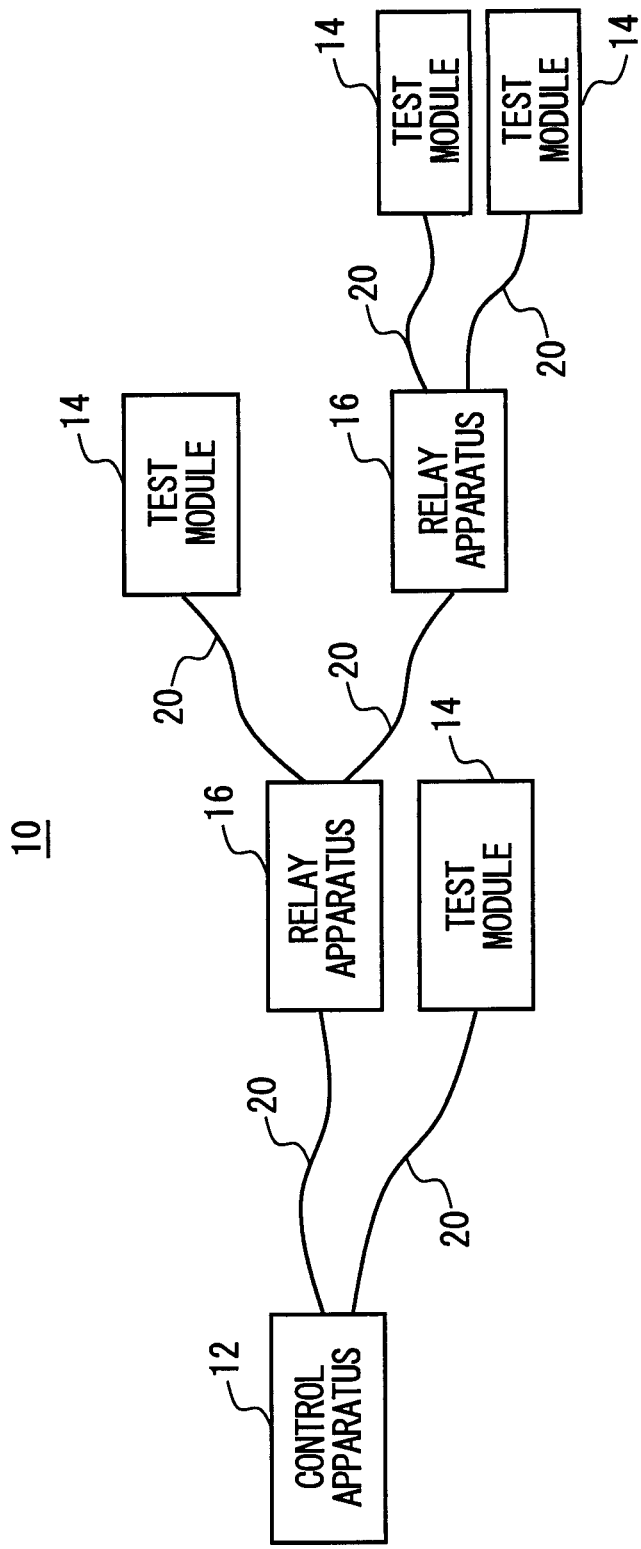
FIG. 1 shows a configuration of a test apparatus 10 according to the present embodiment.

FIG. 1 shows a configuration of a test apparatus 10 according to the present embodiment. The test apparatus 10 tests a device under test such as a semiconductor apparatus. The test apparatus 10 includes a control apparatus 12, a plurality of test modules 14, and a plurality of relay apparatuses 16. The control apparatus 12 executes a control program to control the operation of the control apparatus 12, to control the test of the device under test.

Each test module 14 exchanges signals with the device under test. Each test module 14 supplies a test signal to a device under test, and receives an output signal outputted from the device under test in response to the test signal. Each test module 14 compares, to an expected value, a value of the received output signal. Each test module 14 may be a board installed within a test head.

The plurality of relay apparatuses 16 connect the control apparatus 12 and the plurality of test modules 14. Each relay apparatus 16 includes one port on its upper side and at least one port on its lower side. The upper port of each relay apparatus 16 is connected to either the control apparatus 12 or the lower port of a different relay apparatus 16. The lower port of each relay apparatus 16 is connected to either a test module 14 or the upper port of a different relay apparatus 16. The relay apparatus 16 may be a switch board installed in the test head.

A transmission path 20 is used to connect the control apparatus 12 to a relay apparatus 16, a relay apparatus 16 to a test module 14, and a relay apparatus 16 to another relay apparatus 16. The transmission path 20 may be a cable for transmitting serial data.

The test apparatus 10 has a star-type (or a tree-type) network configuration in which the control apparatus 12 is positioned on top, and the test modules 14 are provided at the bottom. The test apparatus 10 may also have a configuration in which the test modules 14 are directly connected to the control apparatus 12. Moreover, in the test apparatus 10, change in connection state among the control apparatus 12, the relay apparatuses 16, and the plurality of test modules 14, as well as addition or elimination of test module(s) 14 and relay apparatus(es) 16 can be freely performed.

Figure 2:
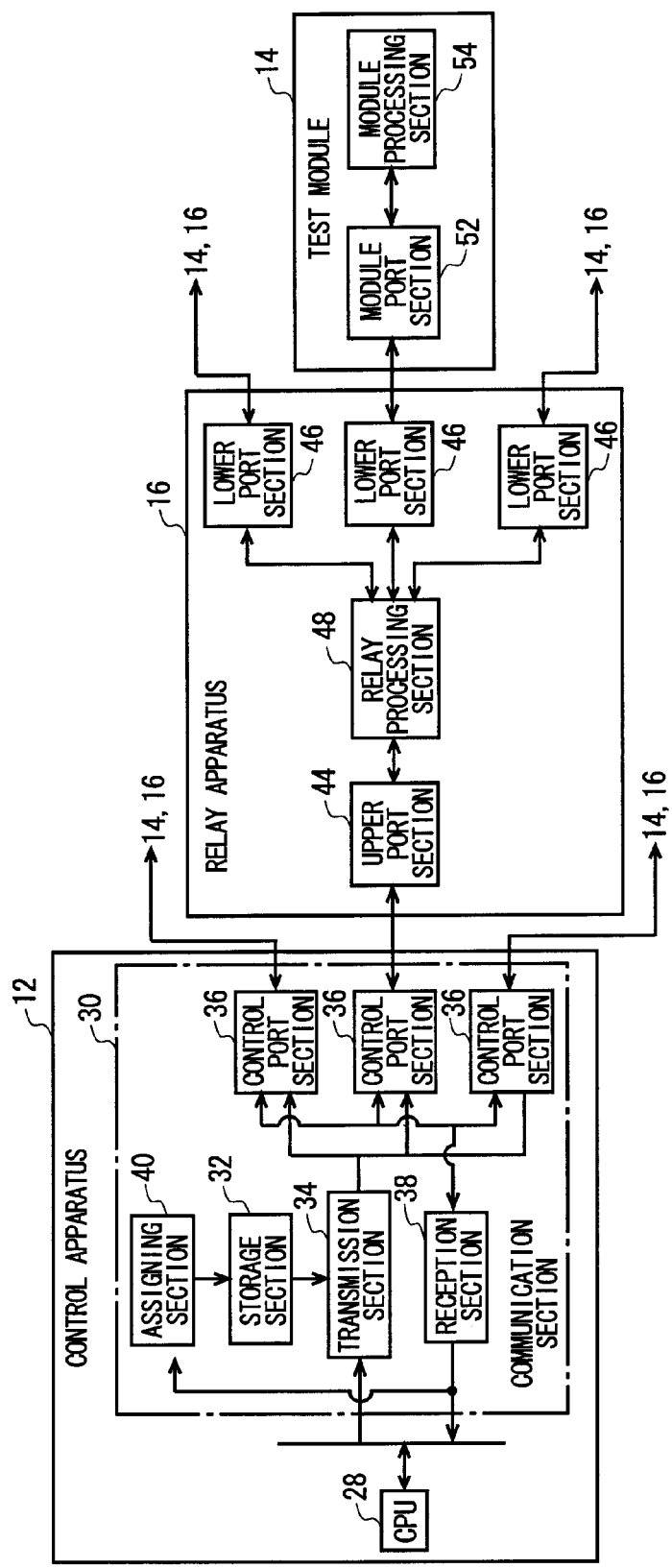
FIG. 2 shows functional blocks of a control apparatus 12, a test module 14 and a relay apparatus 16.

FIG. 2 shows functional blocks of a control apparatus 12, a test module 14 and a relay apparatus 16. The control apparatus 12 includes a CPU 28 and a communication section 30. The CPU 28 issues an access request to each test module 14 by executing a program. The communication section 30 transmits, to the test module 14, an access request supplied by the CPU 28. The communication section 30 receives a response result in response to the access request by the test modules 14, and returns the received response result to the CPU 28.

The communication section 30 includes a storage section 32, a transmission section 34, at least one control port 36, a reception section 38, and an assigning section 40. The storage section 32 stores path information representing the paths to a plurality of test modules 14 from the control apparatus 12, in association with the logic numbers of the test modules 14.

The transmission section 34 transmits a packet to a test module 14 via any of the control port sections 36. The transmission section 34 incorporates, in a packet to be transmitted, a command representing the contents of the access request, as well as path information representing the path to the test module 14 to which the packet is destined as a destination. Also in the initialization, the transmission section 34 transmits a packet including a path information read command (detailed later) to each test module 14.

Each control port section 36 is connected to either a test module 14 or a relay apparatus 16. Each control port section 36 exchanges data with either the test module 14 or the relay apparatus 16 connected thereto.

The reception section 38 receives, via the control port section 36, a return packet that is a packet transmitted from a test module 14 to the control apparatus 12. In the initialization, the reception section 38 identifies the plurality of test modules 14 of the test apparatus 10, based on the plurality of return packets returned from the plurality of test modules 14 respectively, based on the plurality of return packets returned from the plurality of test modules 14 respectively in response to the path information read command. Furthermore, the reception section 38 identifies the path information representing the path to each test module 14 from the control apparatus 12, based on these plurality of return packets.

In the initialization, the assigning section 40 assigns a logic number to each test module 14, in response to reception of the return packet returned from each test module 14 in response to the path information read command.

Each relay apparatus 16 includes a upper port section 44, at least one lower port section 46, and a relay processing section 48. The upper port section 44 is connected either to any of the control port sections 36 of the control apparatus 12, or to any of the lower port sections 46 included in a different relay apparatus 16 that is positioned nearer to the control apparatus 12 (i.e. positioned at the upper side) than this relay apparatus 16. The upper port section 44 exchanges data with the control apparatus 12 or the relay apparatus 16 connected thereto.

Each lower port section 46 is connected either to the test module 14, or to the upper port section 44 included in a different relay apparatus 16 that is positioned nearer to the test module(s) 14 (i.e. positioned at the lower side) than this relay apparatus 16. Each lower port section 46 exchanges data with the test module 14 or the relay apparatus 16 connected thereto.

The relay processing section 48 receives, via the upper port section 44, the packet transmitted from the control apparatus 12 to the test module 14. The relay processing section 48 transmits the received packet from the lower port section 46 designated by the path information included in the packet to the lower side. The relay processing section 48 also receives, via any of the lower port sections 46, a return packet from the test module 14 to the control apparatus 12. The relay processing section 48 transmits the received return packet from the upper port section 44 to the upper side.

Each test module 14 includes a module port section 52 and a module processing section 54. The module port section 52 is connected to any of the lower port sections 46 of a relay apparatus 16, or to any of the control port sections 36 of the control apparatus 12. The module port section 52 exchanges data with the relay apparatus 16 or the control apparatus 12 connected thereto.

The module processing section 54 receives, via the module port section 52, the packet transmitted from the control apparatus 12 to the test module 14. The module processing section 54 executes processing corresponding to the command included in the packet. When the command included in the packet is a read command, the module processing section 54 transmits a return packet including the processing result (i.e., read data) to either the control apparatus 12 or the relay apparatus 16 connected to the test module 14 via the module port section 52.

Here, to each of the plurality of test modules 14, module identification information for enabling the test apparatus 10 to identify the test module 14 in the test apparatus 10 has been set in advance. Each test module 14 stores in a register therein or the like, the module identification information set to the test module 14.

In addition, to each lower port section 46 included in each one of the plurality of relay apparatuses 16, port identification information for identifying the lower port section 46 in the relay apparatus 16 has been set in advance. Each relay apparatus 16 stores in a register therein or the like, the port identification information set to each lower port section 46.

Moreover, to each control port section 36 in the control apparatus 12, control port identification information for identifying the control port section 36 in the control apparatus 12 has been set in advance. The control apparatus 12 stores in a register therein or the like, the control port identification information set to each control port section 36.

Each of the plurality of relay apparatuses 16 stores in a register therein or the like, connection order information designating a connection order of the relay apparatus 16 starting from the control apparatus 12. In other words, each relay apparatus 16 may store in a register therein or the like, whether the relay apparatus 16 is directly connected to the control apparatus 12, indicating that it is the first device (i.e., primary), or that the relay apparatus 16 is connected to the primary relay apparatus 16, indicating that it is the second device (i.e., secondary).

Figure 3:
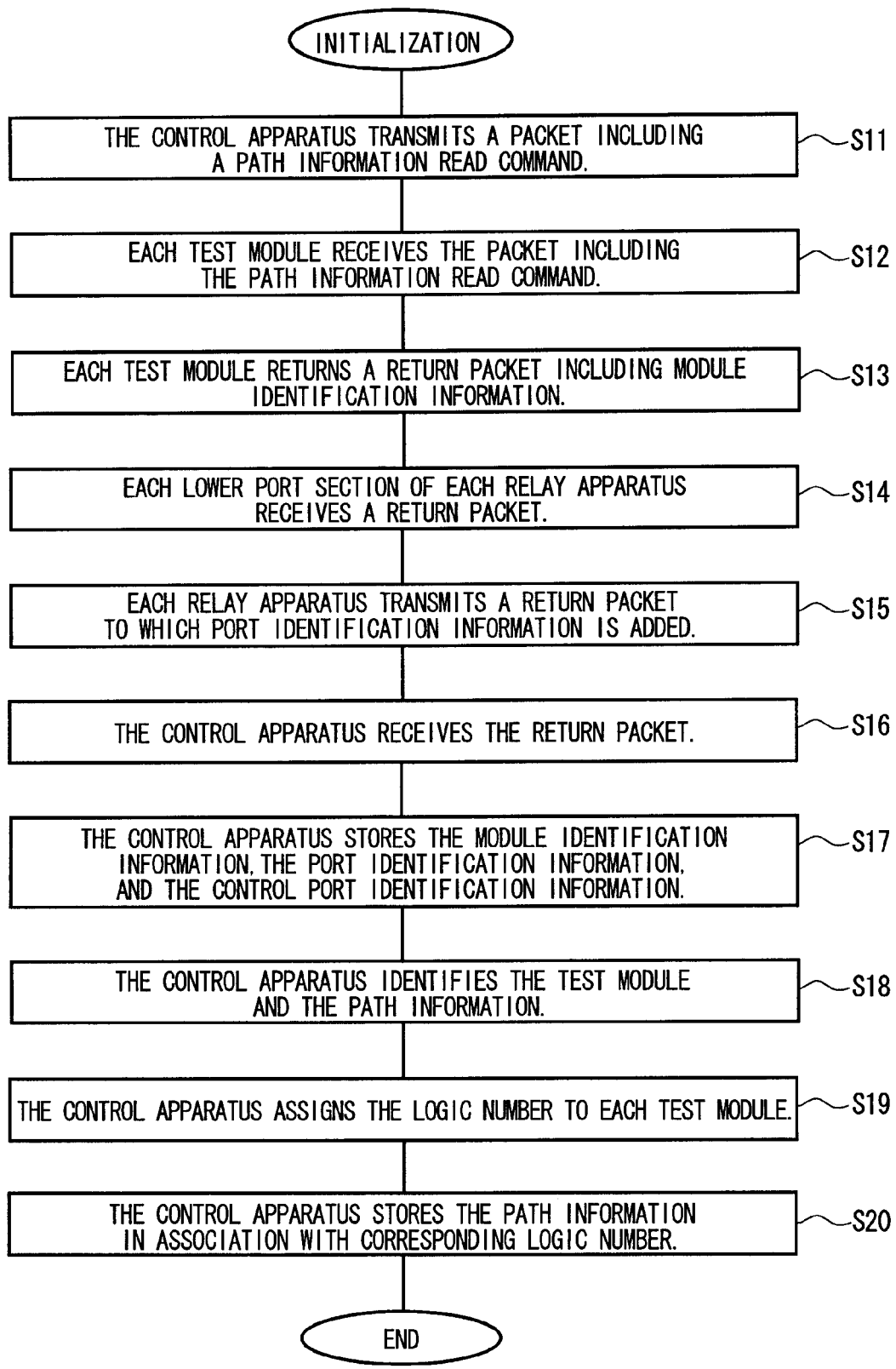
FIG. 3 shows an initialization flow of the test apparatus 10 according to the present embodiment.

FIG. 3 shows an initialization flow of the test apparatus 10 according to the present embodiment. When the plurality of test modules 14 and the relay apparatuses 16 are connected to the control apparatus 12, the test apparatus 10 performs the initialization of FIG. 3 in response to the instruction from a user or the like.

In the initialization, the transmission section 34 of the control apparatus 12 first transmits a packet including a path information read command, to the plurality of test modules 14 via the plurality of relay apparatuses 16 (S11). Here, the path information read command is a read command for recognizing the plurality of test modules 14 connected to the control apparatus 12 via the plurality of relay apparatuses 16. For example, the transmission section 34 of the control apparatus 12 may broadcast the path information read command.

The module processing section 54 in each of the test modules 14 receives the packet including the path information read command transmitted from the control apparatus 12 (S12). Then each test module 14 generates a return packet including module identification information for identifying the test module 14. Then each test module 14 returns the generated return packet to the relay apparatus 16 or the control apparatus 12 connected to the test module 14 (S13).

Each relay apparatus 16 receives the return packet from a different relay apparatus 16 or a test module 14 connected to any of the lower port sections 46 via the lower port section 46 (S14). Next, each relay apparatus 16 adds, to each return packet received by each of the lower port sections 46, the port identification information of the lower port section 46 having received the return packet. Each relay apparatus 16 may further add, to each return packet received by each of the lower port sections 46, connection order information representing the connection order of it from the control apparatus 12 in association with the added port identification information. Then each relay apparatus 16 transmits the packet to which the port identification information and the connection order information have been added, from the upper port section 44 to the relay apparatus 16 or the control apparatus 12 connected to the upper port section 44 (S15).

Next, the reception section 38 of the control apparatus 12 receives a return packet from the relay apparatus 16 or the test module 14 connected to the control port section 36 (S16). Next, the reception section 38 of the control apparatus 12 stores the port identification information and the connection order information included in each of the received return packets, together with the control port identification information of the control port section 36 having received the return packet (S17). Consequently, the reception section 38 can store, for each received return packet, the port identification information and the connection order information of each of the lower port sections 46 on the path from the test module 14 to the control apparatus 12 through which the return packet has passed, as well as the control port identification information.

Next, the reception section 38 of the control apparatus 12 identifies the test module 14 having transmitted each return packet based on the stored module identification information. Furthermore, the reception section 38 of the control apparatus 12 identifies the path information representing the path from the control apparatus 12 to the test module 14 having transmitted the return packet, based on the port identification information and the connection order information, as well as the control port identification information having stored in association with each received return packet (S18).

Next, the assigning section 40 of the control apparatus 12 assigns the logic number to each test module 14, in response to reception of the return packet returned from the test module 14 according to the path information read command (S19). Here, the return packet is transmitted from all the test modules 14 of the test apparatus 10, and so the assigning section 40 can assign the logic number to each of the plurality of test modules 14. Next, the storage section 32 of the control apparatus 12 stores the path information based on the return packet from each test module 14, in association with the logic number of the test module 14 (S20). When the path information and the logic numbers are stored in the storage section 32 for all of the plurality of test modules 14 of the test apparatus 10, the control apparatus 12 is ready to access each of the test modules 14.

The test apparatus 10 according to the present embodiment performs the initialization by reading the module identification information from each test module 14 as stated above. Accordingly, the test module 10 can perform the initialization easily.

Figure 4:
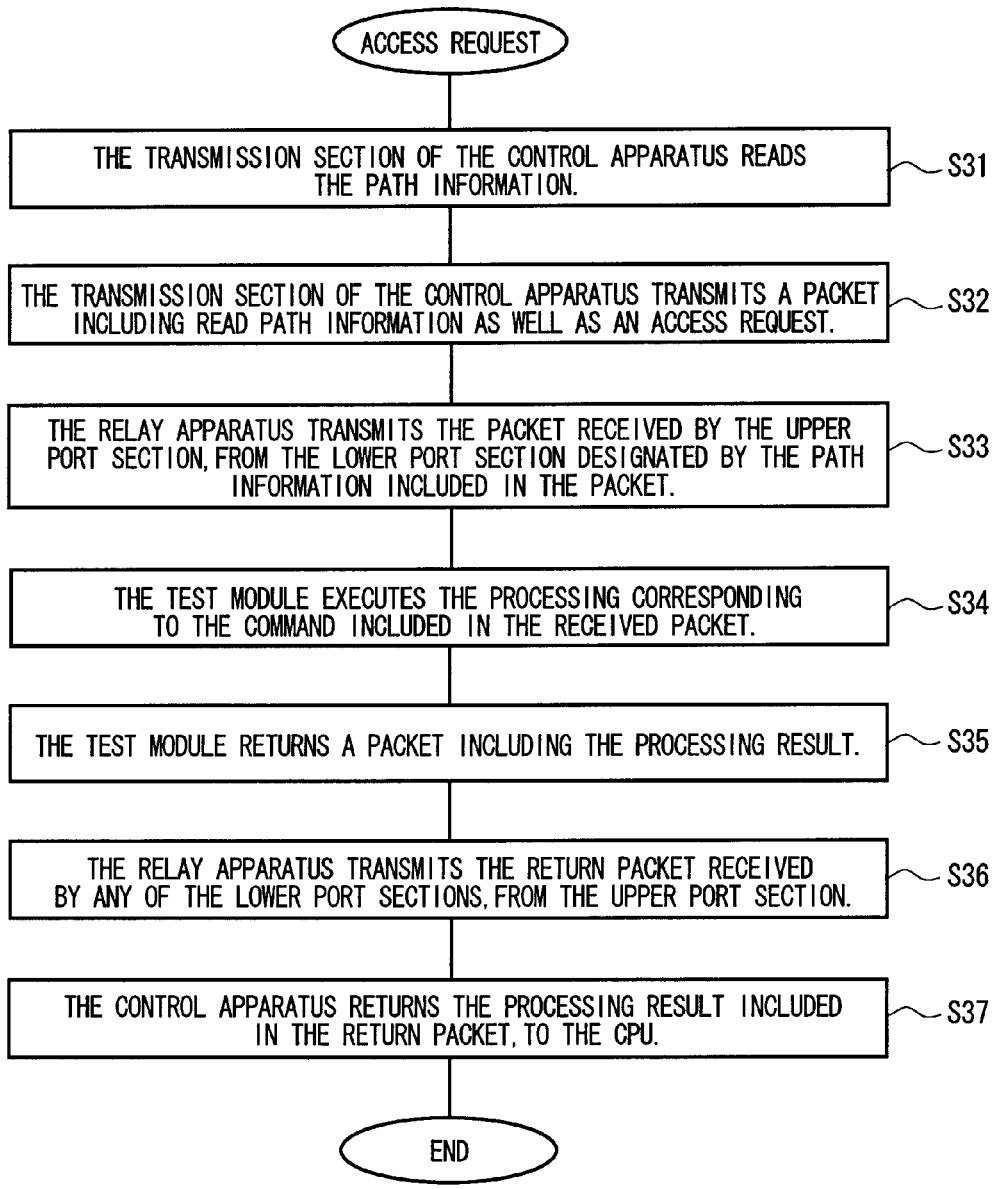
FIG. 4 shows a processing flow of issuing an access request to a test module 14, which is performed by the test apparatus 10 according to the present embodiment.

FIG. 4 shows a processing flow of issuing an access request to a test module 14, which is performed by the test apparatus 10 according to the present embodiment. First, in response to reception of an access request to the test module 14 of the logic number designated by the CPU 28, the transmission section 34 of the control apparatus 12 reads the path information associated with the logic number from the storage section 32 (S31).

Next, the transmission section 34 of the control apparatus 12 generates a packet including a command representing the contents of the access request, as well as including the read path information as a destination. Then, the transmission section 34 of the control apparatus 12 transmits the generated packet from the control port section 36 designated by the read path information, to the relay apparatus 16 or the test module 14 connected to the control apparatus 12 (S32).

Next, the relay apparatus 16 receives the packet including the command and the path information from the upper port section 44. The relay apparatus 16 transmits the packet received via the upper port section 44 from the lower port section 46 designated by the path information included in the packet, to the test module 14 or a different relay apparatus 16 at the lower side (S33).

Next, the test module 14 receives the packet including the command and the path information, via the module port section 52. The test module 14 performs the processing corresponding to the command included in the packet received via the module port section 52 (S34).

When having received a read command, the test module 14 returns a return packet including the processing result (read data) from the module port section 52 (S35). In this case, the test module 14 may add, to the return packet, the module identification information of the test module 14.

Next, the relay apparatus 16 transmits, from the upper port section 44, the return packet received via any of the lower port sections 46 (S36). In this case, the relay apparatus 16 may add, to the return packet, the port identification information of the lower port section 46 having received the return packet.

Next, the control apparatus 12 receives the return packet via any of the control port sections 36. The control apparatus 12 then returns the processing result (read data) included in the received return packet to the CPU 28 as a response to the access request (S37).

As explained above, the test apparatus 10 according to the present embodiment stores the logic numbers respectively of the plurality of test modules 14 and the path information from the control apparatus 12 to each test module 14. Therefore, the test apparatus 10 can transfer an access request to an access-target test module 14, by simply reading the path information of the access-target test module 14 and sending the packet after incorporating thereto the path information as a destination. According to this configuration, There will be no need that the test apparatus 10 determine the test module 14 that is assigned the address range corresponding to the address designated by the address request.

Figure 5:
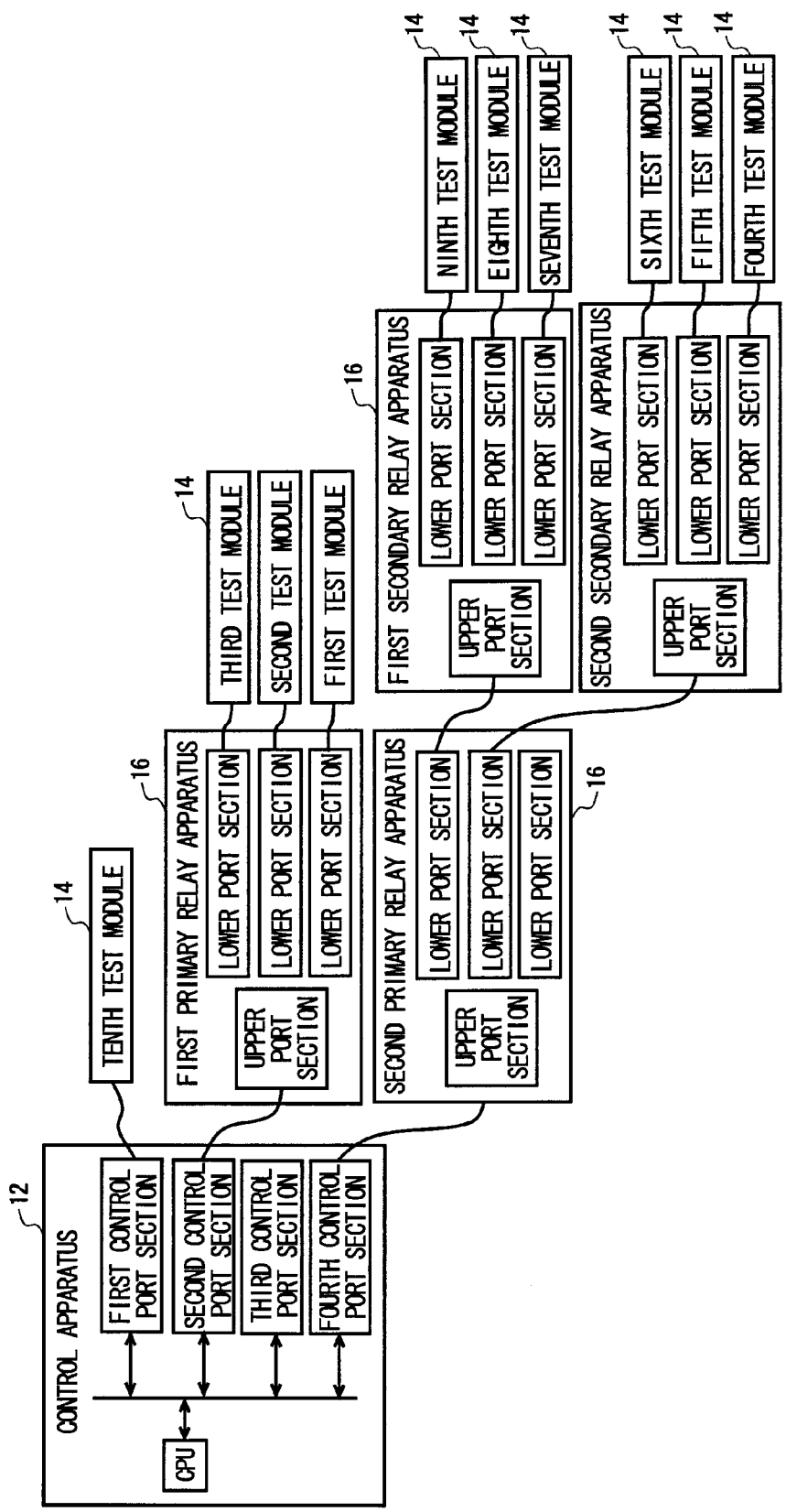
FIG. 5 shows an exemplary connection of the test apparatus 10.

FIG. 5 shows an exemplary connection of the test apparatus 10. For example, the test apparatus 10 includes a control apparatus 12, first and second primary relay apparatuses 16, first and second secondary relay apparatuses 16, and first through tenth test modules 14.

In this example, the control apparatus 12 includes first through fourth control port sections 36. The tenth test module 14 is connected to the first control port section 36. The first primary relay apparatus 16 is connected to the second control port section 36. No device is connected to the third control port section 36. The second primary relay apparatus 16 is connected to the fourth control port section 36.

Also in this example, each relay apparatus 16 includes first through third lower port sections 46. The third, second, and first test modules 14 are respectively connected to the first, second, and third lower port sections 46 of the first primary relay apparatus 16.

The first secondary relay apparatus 16 is connected to the first lower port section 46 of the second primary relay apparatus 16. The second secondary relay apparatus 16 is connected to the second lower port section 46 of the second primary relay apparatus 16.

The sixth, fifth, and fourth test modules 14 are respectively connected to the first, second, and third lower port sections 46 of the first secondary relay apparatus 16. The ninth, eighth, and seventh test modules 14 are respectively connected to the first, second, and third lower port sections 46 of the second secondary relay apparatus 16.

The following explains the concrete processing taking an example of a test apparatus 10 having the stated configuration.

Figures 6, 7:
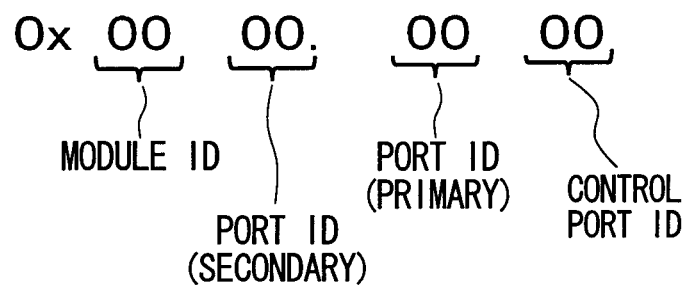
FIG. 6 shows exemplary data obtained by the control apparatus 12 in association with each return packet transmitted by each test module 14 in response to a path information read command, regarding the test apparatus 10 of FIG. 5.
FIG. 7 shows the contents of each bit field of the data shown in FIG. 6.

FIG. 6 shows exemplary data obtained by the control apparatus 12 in association with each return packet transmitted by each test module 14 in response to a path information read command, regarding the test apparatus 10 of FIG. 5. FIG. 7 shows the contents of each bit field of the data shown in FIG. 6.

The control apparatus 12 obtains the data of 32 bits as shown in FIG. 6, in association with each return packet transmitted from each test module 14 in response to a path information read command.

The values from the first bit through the eighth bit of each piece of data shown in FIG. 6 represent the control port identification information for identifying the control port section 36 having received the corresponding return packet. In addition, the values from the ninth bit through the sixteenth bit represent the port identification number for identifying the lower port section 46 of the primary relay apparatus 16 through which the corresponding return packet has passed. The values from the seventeenth bit through the twenty-fourth bit represent the port identification information for identifying the lower port section 46 of the secondary relay apparatus 16 through which the corresponding return packet has passed. The values from the twenty-fifth bit through the thirty-second bit represent the module identification information for identifying the test module 14 having transmitted the corresponding return packet.

Therefore, for example the ninth piece of data from the top of FIG. 6 has "04" as the first through the eighth bits, which means that the return packet corresponding to the data has been received by the fourth control port section 36. In addition, the data has "02" as the ninth through the sixteenth bits, which means that the return packet corresponding to the data has passed the second lower port section 46 included in the primary relay apparatus 16. In addition, the data has "01" as the seventeenth through twenty-fourth bits, which means that the return packet corresponding to the data has passed the first lower port section 46 included in the secondary relay apparatus 16. Moreover, the data has "06" as the twenty-fifth through thirty-second bits, which means that the return packet corresponding to the data has been returned from the sixth test module 14.

The control apparatus 12 obtains the explained data for each return packet as a result of transmitting a path information read command, and so can identify the module identification information and the path information for all the test modules 14 connected to the test apparatus 10.

FIG. 8 shows an example of path information and logic numbers stored in a storage section 32. The control apparatus 12 identifies the types of all the test modules 14 connected to the test apparatus 10, based on the module identification information added to each return packet transmitted from each test module 14 in response to a path information read command. Then the control apparatus 12 assigns a unique logic number to each of all the identified test modules 14, so that the CPU 28 can access them. The control apparatus 12 also identifies the path information representing the transmission path of the packet from the control apparatus 12 to each test module 14, based on the port identification information added to each return packet transmitted from each test module 14 in response to a path information read command as well as on the control port identification information indicating the control port section 36 having received each return packet.

The storage section 32 stores sets of logic numbers and path information for the test modules 14 connected to the test apparatus 10, in association with each other. The storage section 32 may store, as path information, the value of FIG. 6 excluding the module identification information (i.e. the values of the twenty-fifth through thirty-second bits). The storage section 32 may store the sets of logic numbers and path information in the order of the logic numbers. Accordingly, when the CPU 28 attempts to issue an access request to a test module 14 by designating a logic number, the transmission section 34 can read, from the storage section 32, the path information showing a destination to which the command to designate the access request.

Note that the storage section 32 may be provided in advance with a region for storing the sets of path information and the logic numbers in number (e.g. 64) corresponding to the number of the test modules 14 connectable to the test apparatus 10. In addition, the storage section 32 may store a reset value stored in each storage region after being reset.

Figure 9:
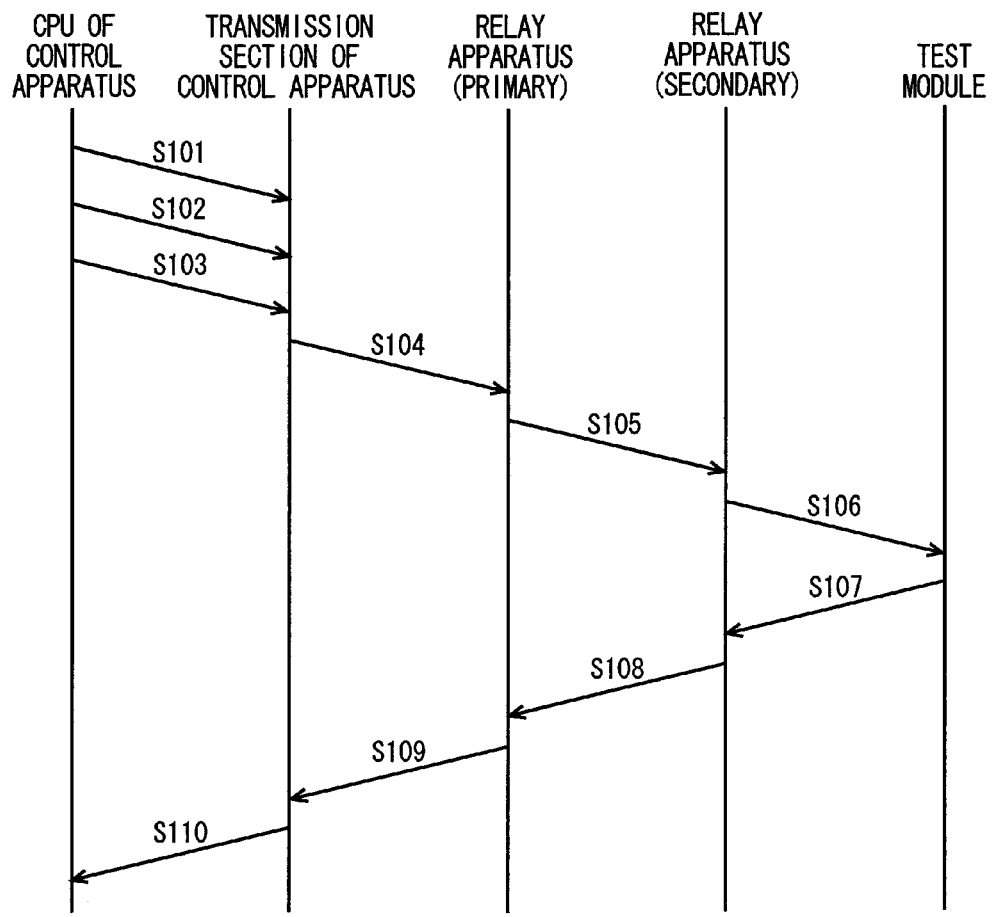
FIG. 9 shows a processing flow which results when a CPU 28 in the test apparatus 10 shown in FIG. 5 has issued an access request to a test module 14.

FIG. 9 shows a processing flow which results when a CPU 28 in the test apparatus 10 shown in FIG. 5 has issued an access request to a test module 14. FIGS. 10 through FIG. 13 show an exemplary packet transmitted as a result of the processing of FIG. 9.

In Step S101, the CPU 28 writes the logic number of the test module 14 to be accessed, to the logic number designation register in the transmission section 34, for example. Next in Step S102, the CPU 28 writes the offset value of the address to be accessed from the entry point of the test module 14, to the address designation register in the transmission section 34.

Next in Step S103, the CPU 28 accesses the register functioning, in the transmission section 34, as a trigger to transmit the designated access request to the test module 14. In this example, the CPU 28 performs a read access to the register functioning as a trigger to transmit a read command.

Next in Step S104, the transmission section 34 of the control apparatus 12 generates a packet including a code representing the contents of the command, the path information, and the offset value. In this case, the transmission section 34 reads the path information stored in association with the logic number written to the logic number designation register and incorporating the path information in the packet read from the storage section 32. Then the transmission section 34 transmits the generated packet from the control port section 36 designated by the read path information.

For example, the transmission section 34 generates a packet as shown in FIG. 10. Specifically, the transmission section 34 generates a packet including, in the header portion (Command), a code (Code0="0×24") representing a read command (Normal Single Read24). Furthermore, the transmission section 34 generates a packet including, in the header portion, port identification information (Primarry Switch field="0×02") designating the second lower port section 46 through which the packet in the primary relay apparatus 16 is to be passed. Furthermore, the transmission section 34 generates a packet including, in the header portion, port identification information (Secondary Switch field="0×01") designating the first lower port section 46 through which the packet in the secondary relay apparatus 16 is to be passed. Still further, the transmission section 34 generates a packet including, in the address portion (A0-A2), an offset value (0×120) of the test module 14 to be accessed, from the entry. Then the transmission section 34 transmits the generated packet from the control port section 36 (the fourth control port section 36 in this example) designated by the read path information.

Next in Step S105, the primary relay apparatus 16 receives the packet from the control apparatus 12, and transmits the received packet from the lower port section 46 identified by the path information. In this example, the second primary relay apparatus 16 receives the packet from the fourth control port section 36 of the control apparatus 12. Then the second primary relay apparatus 16 transmits the received packet, from the second lower port section 46 described in the port identification information designating the lower port section 46 of the primary relay apparatus 16 through which the packet is to be passed.

Next in Step S106, the secondary relay apparatus 16 receives the packet from the primary relay apparatus 16, and transmits the received packet from the lower port section 46 indicated in the path information. In this example, the first secondary relay apparatus 16 receives the packet from the second primary relay apparatus 16. Then the first secondary relay apparatus 16 transmits the received packet, from the first lower port section 46 described in the port identification information designating the lower port section 46 of the secondary relay apparatus 16 through which the packet is to be passed.

Next in Step S107, the test module 14 receives the packet from the secondary relay apparatus 16, and executes the operation designated by the code of the received packet. Then the test module 14 returns a return packet including the execution result (read data) to the secondary relay apparatus 16. In this example, the sixth test module 14 receives the packet from the first secondary relay apparatus 16, and reads the data from the address obtained by adding the offset value (0×120) to the entry point. Then the sixth test module 14 returns a return packet including the execution result (read data) to the first secondary relay apparatus 16.

For example, the test module 14 generates a return packet as shown in FIG. 11. Specifically, the test module 14 generates a packet including, in the header portion (Command), a code (Code0="0×25") representing response data of a read command (Normal Single Read Data24). Furthermore, the test module 14 generates a packet including, in the address portion (A0-A2), an offset value (0×120) of the test module 14 to be accessed, from the entry. Still further, the test module 14 generates a return packet including, in the payload portion (D0-D3), the read data (0×12345678). Then the test module 14 transmits the return packet to the relay apparatus 16 connected to the test module 14.

Next in Step S108, the secondary relay apparatus 16 receives the return packet from the test module 14, and adds, to the received return packet, the port identification information of the lower port section 46 having received the return packet. Then the secondary relay apparatus 16 transmits the return packet to which the port identification information has been added, from the upper port section 44 to the primary relay apparatus 16. In this example, as shown in FIG. 12, the first secondary relay apparatus 16 describes the port identification number (0×01) of the first lower port section 46, to the region (Secondary Switch field), in the received return packet, to which the port identification information designating the lower port section 46 of the secondary relay apparatus 16 is described.

Next in Step S109, the primary relay apparatus 16 receives the return packet from the secondary relay apparatus 16, and adds, to the received return packet, the port identification information of the lower port section 46 having received the return packet. Then the primary relay apparatus 16 transmits the return packet to which the port identification information has been added, from the upper port section 44 to the control apparatus 12. In this example, as shown in FIG. 13, the second primary relay apparatus 16 describes the port identification number (0×02) of the second lower port section 46, to the region (Primarry Switch field), in the received return packet, to which the port identification information designating the lower port section 46 of the primary relay apparatus 16 is described.

Next in Step S110, the reception section 38 of the control apparatus 12 receives the return packet from the primary relay apparatus 16. Then the reception section 38 of the control apparatus 12 returns the execution result (read data=0× 12345678) included in the received return packet, to the access from the CPU 28 that has been in wait in the "retry" for example.

As described above, the test apparatus 10 can easily transmit an access request to the designated test module 14, based on the path information stored by the control apparatus 12 in the initialization.

Figure 14:
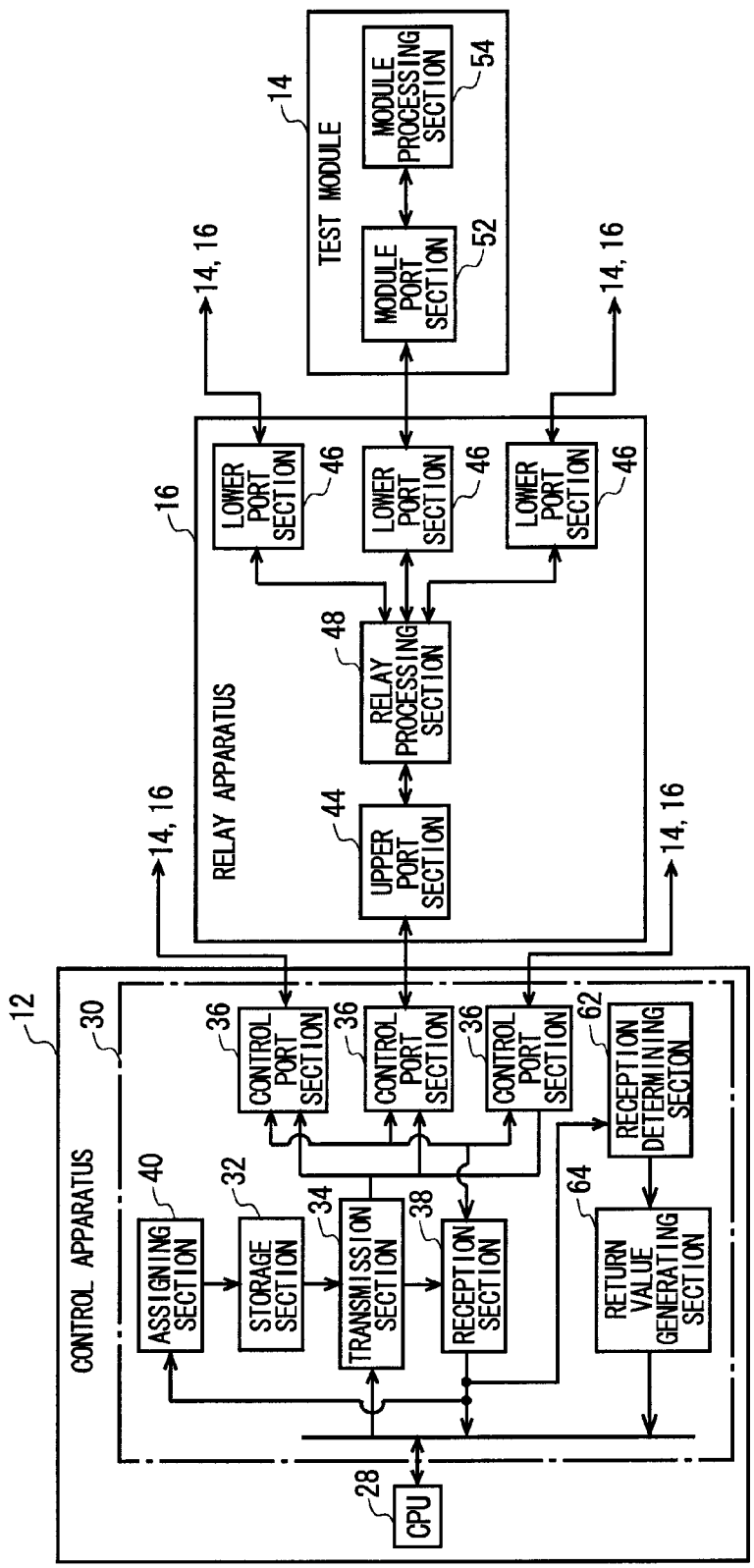
FIG. 14 shows functional blocks of a control apparatus 12, a test module 14, and a relay apparatus 16 according to a modification example of the present embodiment.

FIG. 14 shows functional blocks of a control apparatus 12, a test module 14, and a relay apparatus 16 according to a modification example of the present embodiment. The test apparatus 10 in this modification example has substantially the same configuration and function as those of the test apparatus 10 according to the present embodiment, and so substantially the same configuration and function are assigned the same reference numerals as those of the test apparatus 10 of the present embodiment, and the following does not provide the explanation of them except for the differences.

The communication section 30 included in the control apparatus 12 of this modification example further includes a reception determining section 62 and a return value generating section 64. When a broadcast read has been transmitted to the test modules 14, the reception determining section 62 determines whether the return packets have been received from each of the test modules 14. When the reception determining section 62 has determined that the return packets have been received from all the test modules 14, the return value generating section 64 generates a return value based on the return data from the test modules 14.

Furthermore in this modification example, when the association between the logic numbers and the path information has been initialized, the storage section 32 associates the logic numbers to the respective lower port sections 46 in the relay apparatus 16 connected to the control apparatus 12, and stores the path information indicating that the broadcast read should be transmitted from these lower port sections 46 to a lower side.

In case of issuing a broadcast read for reading data in parallel from the plurality of test modules 14 by a single command issuance, the test apparatus 10 according to this modification example operates as follows. Specifically, in response to a request from the CPU 28 to perform a broadcast read, the transmission section 34 of the control apparatus 12 reads path information indicating that the broadcast read should be transmitted form the storage section 32.

Next, the transmission section 34 generates a packet including a command representing the broadcast read, as well as including the read path information as a destination. Then, the transmission section 34 of the control apparatus 12 transmits the generated packet from each of at least one control port section 36 (e.g., all the control port sections 36) designated by the path information, to the lower side.

The plurality of test modules 14 receive the packet including the command representing the broadcast read. Each of the plurality of test modules 14 having received this packet performs a read operation corresponding to the received command, and returns a return packet including the processing result (read data) to the control apparatus 12.

The reception determining section 62 determines whether the return packets have been received from all the plurality of test modules 14 to which the broadcast read has been transmitted. When the reception determining section 62 has determined that the return packets have been received from all the plurality of test modules 14, the return value generating section 64 generates a return value based on the return data from the plurality of test modules 14, and returns the generated return value to the CPU 28.

For example, the return value generating section 64 may generate a bitmap in which the pieces of return data of the plurality of test modules 14 are arranged. In another example, the return value generating section 64 may calculate, as the return value, AND, inverted AND, logical OR, or NOR of the return data from the plurality of test modules 14.

As explained above, the test apparatus 10 according to this modification example can easily perform the processing corresponding to a broadcast read.

While the embodiment(s) of the present invention has (have) been described, the technical scope of the invention is not limited to the above described embodiment(s). It is apparent to persons skilled in the art that various alterations and improvements can be added to the above-described embodiment(s). It is also apparent from the scope of the claims that the embodiments added with such alterations or improvements can be included in the technical scope of the invention.

For example, the present invention is not limited to a test apparatus 10, and can also be a system transmitting generalpurpose data. In other words, the technology described in the above embodiments may be applied to a system including a control apparatus, a plurality of modules, and a plurality of relay apparatuses connecting the control apparatus and the plurality of modules. In this case, the control apparatus of the system is provided with a communication processing function that is similar to that of the control apparatus 12 of the present embodiment, the modules of the system are provided with a communication processing function that is similar to that of the test modules 14 of the present embodiment, and the relay apparatuses of the system are provided with a communication function that is similar to that of the relay apparatuses 16 of the present embodiment.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, specification, or drawings, it does not necessarily mean that the process must be performed in this order.

What is claimed is:

1. A test apparatus for testing a device under test, comprising:
   a control apparatus that controls a test of the device under test;
   a plurality of test modules that exchange signals with the device under test; and
   a plurality of relay apparatuses that connect the control apparatus and the plurality of test modules, each relay apparatus including (1) an upper port section connected either to the control apparatus or to a relay apparatus nearer the control apparatus; and (2) at least one lower port section connected either to a relay apparatus nearer the plurality of test modules or to a corresponding test module, wherein
   each relay apparatus receives, at one of the at least one lower port section, a packet transmitted from the corresponding test module to the control apparatus, and transmits, from the upper port section, the received packet after adding thereto port identification information of the one of the at least one lower port section, and
   the control apparatus identifies, based on port identification information of each of lower port sections positioned on a path from the corresponding test module to the control apparatus, path information to the test module having transmitted the packet.

2. The test apparatus according to claim 1, wherein
   the control apparatus includes a transmission section that transmits, via the plurality of relay apparatuses to the plurality of test modules, a path information read command for recognizing the plurality of test modules connected to the control apparatus via the plurality of relay apparatuses,
   each of the plurality of test modules returns a return packet including module identification information identifying the test module to the relay apparatus or the control apparatus connected to the test module, and
   each of the plurality of relay apparatuses transmits, from the upper port section, the return packet received by the lower port section after adding thereto port identification information of the lower port section.

3. The test apparatus according to claim 2, wherein
   the control apparatus includes:
   an assigning section that, in response to reception of the return packet returned from each of the plurality of test modules in response to the path information read command, assigns a logic number to the test module; and
   a storage section that stores the path information based on the return packet from the test module in association with the logic number.

4. The test apparatus according to claim 3, wherein
   in response to initialization of an association between the logic numbers and the path information, the storage section associates logic numbers to the lower port sections of the relay apparatus connected to the control apparatus, and stores the path information indicating that a broadcast read should be transmitted from the lower port sections to a lower side.

5. The test apparatus according to claim 3, wherein
   in response to reception of an access request to the test module corresponding to a designated logic number, the transmission section of the control apparatus reads, from the storage section, the path information associated with the designated logic number, and further transmits a packet including the path information as a destination, to the relay apparatus connected to the control apparatus, and
   each of the plurality of relay apparatuses transmits a packet received by the upper port section, from the lower port section designated by the path information of the packet, to a lower side.

6. The test apparatus according to claim 5, wherein
   the control apparatus includes:
   a reception determining section that determines whether the return packet from each of the plurality of test modules has been received in response to transmission of a broadcast read to the plurality of test modules; and
   a generating section that generates a return value based on return data from the plurality of test modules, when it is determined that the return packets have been received from all the plurality of test modules.

7. The test apparatus according to claim 6, wherein
   the return value generating section generates, as the return value, a bitmap in which pieces of return data from the plurality of test modules are arranged.

8. The test apparatus according to claim 6, wherein
   the return value generating section generates, as the return value, AND, inverted AND, logical OR, or NOR of pieces of return data from the plurality of test modules.

9. A test method performed by a test apparatus that tests a device under test, wherein
   the test apparatus includes:
   a control apparatus that controls a test of the device under test;
   a plurality of test modules that exchange signals with the device under test; and
   a plurality of relay apparatuses that connect the control apparatus and the plurality of test modules, each relay apparatus including (1) an upper port section connected either to the control apparatus or to a relay apparatus nearer the control apparatus; and (2) at least one lower port section connected either to a relay apparatus nearer the plurality of test modules or to a corresponding test module, the method comprising:
   receiving, by each relay apparatus, at one of the at least one lower port section, a packet transmitted from the corresponding test module to the control apparatus, and transmitting, from the upper port section, the received packet after adding thereto port identification information of the one of the at least one lower port section, and
   identifying, by the control apparatus, based on port identification information of each of lower port sections positioned on a path from the corresponding test module to the control apparatus, path information to the test module having transmitted the packet.

10. A system comprising:
    a control apparatus;
    a plurality of modules; and
    a plurality of relay apparatuses that connect the control apparatus and the plurality of modules, each relay apparatus including (1) an upper port section connected either to the control apparatus or to a relay apparatus nearer the control apparatus; and (2) at least one lower port section connected either to a relay apparatus nearer the plurality of modules or to a corresponding module, wherein each relay apparatus receives, at one of the at least one lower port section, a packet transmitted from the corresponding module to the control apparatus, and transmits, from the upper port section, the received packet after adding thereto port identification information of the one of the at least one lower port section, and the control apparatus identifies, based on port identification information of each of the lower port sections positioned on a path from the corresponding module to the control apparatus, path information to the module having transmitted the packet.

* * * * *